(12) United States Patent
Ban et al.

(10) Patent No.: US 8,409,734 B2
(45) Date of Patent: Apr. 2, 2013

(54) COATED SUBSTRATES AND METHODS OF MAKING SAME

(75) Inventors: Zhigang Ban, Latrobe, PA (US); Yixong Liu, Greensburg, PA (US); Mark S. Greenfield, Greensburg, PA (US)

(73) Assignee: Kennametal Inc., Latrobe, PA (US)

( * ) Notice: Subject to any disclaimer, the term of this patent is extended or adjusted under 35 U.S.C. 154(b) by 6 days.

(21) Appl. No.: 13/040,641

(22) Filed: Mar. 4, 2011

(65) Prior Publication Data

US 2012/0225285 A1 Sep. 6, 2012

(51) Int. Cl.
*B32B 9/00* (2006.01)

(52) U.S. Cl. ............ 428/698; 51/307; 51/309; 428/336; 428/697; 428/699; 428/701; 428/702

(58) Field of Classification Search ............ 51/307, 51/309; 428/216, 336, 697, 698, 699, 701, 428/702

See application file for complete search history.

(56) References Cited

U.S. PATENT DOCUMENTS

| | | | |
|---|---|---|---|
| 4,599,281 A * | 7/1986 | Schintlmeister et al. ..... | 428/699 |
| 4,714,660 A | 12/1987 | Gates, Jr. | |
| 4,720,437 A | 1/1988 | Chudo et al. | |
| 5,700,569 A | 12/1997 | Ruppi | |
| 5,770,261 A | 6/1998 | Nakamura et al. | |
| 5,981,049 A * | 11/1999 | Ohara et al. ................ | 428/697 |
| 5,985,427 A | 11/1999 | Ueda et al. | |
| 6,093,479 A | 7/2000 | Yoshimura et al. | |
| 6,156,383 A | 12/2000 | Ishii et al. | |
| 6,207,262 B1 | 3/2001 | Ichikawa et al. | |
| 6,284,356 B1 | 9/2001 | Kiriyama | |
| 6,426,137 B1 * | 7/2002 | Oshika et al. ................ | 428/336 |
| 6,436,519 B2 | 8/2002 | Holzschuh | |
| 6,472,060 B1 | 10/2002 | Ruppi et al. | |

(Continued)

FOREIGN PATENT DOCUMENTS

| EP | 0247630 A2 | 12/1987 |
|---|---|---|
| EP | 0263747 B1 | 8/1993 |

(Continued)

OTHER PUBLICATIONS

Fox-Rabinovich et al., "Elastic and Plastic Work of Indentation as a Characteristic of Wear Behavior for Cutting Tools with Nitride PVD Coatings", Thin Solid Films 469-470 (2004) pp. 505-512.

(Continued)

*Primary Examiner* — Archene Turner
(74) *Attorney, Agent, or Firm* — Matthew W. Gordon, Esq.

(57) ABSTRACT

Coated substrates having high wear resistant coatings are disclosed. The coatings include at least one layer of either titanium oxycarbonitride or titanium aluminum oxycarbonitride, such that the layer has an oxygen to titanium atomic percent ratio in the range of about 0.01 to about 0.09 and an aluminum to titanium atomic percent ratio in the range of about 0 to about 0.1. The coatings have a hardness to Young's modulus ratio of at least 0.06. The substrate may be a cutting insert. Methods of making such coated substrates are also disclosed in which layers comprising titanium oxycarbonitride or titanium aluminum oxycarbonitride are deposited by medium temperature chemical vapor deposition (MT-CVD) on substrates in the temperature range of about 750 to about 950° C. using a mixture of gases wherein the ratio of the hydrogen gas to the nitrogen gas is greater than 5.

23 Claims, 2 Drawing Sheets

U.S. PATENT DOCUMENTS

| | | |
|---|---|---|
| 6,620,498 B2 | 9/2003 | Ruppi et al. |
| 7,455,918 B2 * | 11/2008 | Gates et al. .................. 428/701 |
| 7,718,226 B2 | 5/2010 | Ruppi |
| 7,771,847 B2 * | 8/2010 | Kukino et al. ................ 428/698 |
| 7,785,665 B2 | 8/2010 | Gates, Jr. et al. |
| 8,025,958 B2 * | 9/2011 | Yamamoto et al. ........... 428/216 |
| 2007/0298232 A1 | 12/2007 | McNerny et al. |

FOREIGN PATENT DOCUMENTS

| | | |
|---|---|---|
| EP | 0686707 A1 | 12/1995 |
| EP | 0786536 A1 | 7/1997 |
| EP | 0900860 A2 | 3/1999 |
| EP | 1209255 A2 | 5/2002 |

OTHER PUBLICATIONS

Beak, "Guest Editorial—How to Predict and Improve Coating Performance by Nanomechanical Testing," Surface Engineering, vol. 23, No. 3 (2007) pp. 155-156.

\* cited by examiner

COATED SUBSTRATES AND METHODS OF MAKING SAME

FIELD OF THE INVENTION

The present invention relates to wear resistant coatings for substrates, the coatings comprising titanium oxycarbonitride and/or titanium aluminum oxycarbonitride, and to substrates having such coatings, and more particularly to cutting inserts having such coatings. The coatings are useful for providing improved wear resistance to the substrates, especially when the substrates are cutting inserts. The invention also relates to methods of applying such coatings to substrates.

BACKGROUND OF THE INVENTION

Coated substrates, for example, coated cutting inserts, are used in material removal applications. The coating layers typically comprise hard refractory materials that exhibit the property of wear resistance. One purpose of such coatings on cuttings insert is to lengthen the service life of the cutting inserts.

One hard refractory material that has been found to be useful as a coating layer material, or as part of a scheme of coating layers, is titanium oxycarbonitride, which is sometimes referred to by the generic formula Ti (C,N,O). Another is titanium aluminum oxycarbonitride, which is sometimes referred to by the generic formula (Ti, Al)(C,N,O). Examples of coatings comprising at least one of these materials can be found in U.S. Pat. No. 4,714,660 to Gates, Jr.; U.S. Pat. No. 5,700,569 to Ruppi; U.S. Pat. No. 6,284,356 B1 to Kiriyama; U.S. Pat. No. 6,436,519 B2 to Holzschuh; U.S. Pat. No. 6,472,060 B1 to Ruppi et al.; U.S. Pat. No. 6,620,498 B2 to Ruppi et al.; U.S. Pat. No. 7,718,226 B2 to Ruppi; U.S. Pat. No. 7,785,665 B2 to Gates, Jr. et al.; and U.S. Pat. Application Publication No. US 2007/0298232 A1 of McNerny et al.

Although the usefulness of coatings comprising titanium oxycarbonitride and/or titanium aluminum oxycarbonitride has been demonstrated, improvements are still needed in the wear resistance they provide. The present invention addresses this need.

SUMMARY OF THE INVENTION

The present invention provides high wear resistant coatings for a substrate. The inventive coatings include at least one layer of a compound selected from the group consisting of titanium oxycarbonitride and titanium aluminum oxycarbonitride, wherein the compound has an oxygen to titanium atomic percent ratio in the range of about 0.01 to about 0.09 and an aluminum to titanium atomic percent ratio in the range of about 0 to about 0.1. The coatings have the ratio of their hardness values (in gigaPascals) to their Young's modulus values (in gigaPascals) at 0.06 or higher. The substrate may be of any desired shape and may be a cemented carbide (e.g., tungsten carbide-cobalt materials), a ceramic (e.g., silicon nitride-based ceramic, a SiAlON-based ceramic, a titanium carbonitride-based ceramic, a titanium diboride-based ceramic, and an alumina-based ceramic), a cermet (e.g., a cermet that has a nickel-cobalt binder and a high level of titanium and could further include tungsten carbide and titanium carbide), a steel, or a superhard material, e.g., polycrystalline cubic boron nitride (PCBN). Preferably, the substrate is in the form of a cutting insert.

The present invention also includes coated substrates having such coatings, for example, cutting inserts having such coatings.

The present invention also includes methods of making such coated substrates. In such methods, coating layers comprising titanium oxycarbonitride and/or titanium aluminum oxycarbonitride are deposited by medium temperature chemical vapor deposition (MT-CVD) on substrates in the temperature range of about 750 to about 950° C. using a mixture of gases comprising titanium tetrachloride ($TiCl_4$), a carbon source, e.g., acetonitrile ($CH_3CN$), nitrogen ($N_2$), hydrogen ($H_2$), an oxygen source, e.g., carbon monoxide (CO), nitrous oxide ($N_2O$), or nitric oxide (NO), and, when the layer comprises titanium aluminum oxycarbonitride, aluminum trichloride ($AlCl_3$), wherein the ratio of the hydrogen gas to the nitrogen gas, i.e., the $H_2/N_2$ ratio, is greater than 5.

BRIEF DESCRIPTION OF THE DRAWINGS

The criticality of the features and merits of the present invention will be better understood by reference to the attached drawings. It is to be understood, however, that the drawings are designed for the purpose of illustration only and not as definitions of the limits of the present invention.

DETAILED DESCRIPTION OF PREFERRED EMBODIMENTS OF THE INVENTION

In this section, some preferred embodiments of the present invention are described in detail sufficient for one skilled in the art to practice the present invention. It is to be understood, however, that the fact that a limited number of preferred embodiments are described herein does not in any way limit the scope of the present invention as set forth in the appended claims.

Whenever the term "about" is used herein or in the appended claims to modify a feature of an embodiment of the present invention, it is to be construed as referring to the ordinary tolerances related to making and/or measuring the relevant feature. Whenever a range is used herein or in the appended claims to describe a feature of an embodiment of the present invention, the range is to be construed as including the stated end points of the range and every point therebetween. The phrases "inventive titanium oxycarbonitride" and "inventive titanium aluminum oxycarbonitride" are to be construed meaning, respectively, titanium oxycarbonitride or titanium aluminum oxycarbonitride, wherein the compound has an oxygen to titanium atomic percent ratio in the range of about 0.01 to about 0.09 and an aluminum to titanium atomic percent ratio in the range of about 0 to about 0.1.

Figure 1:
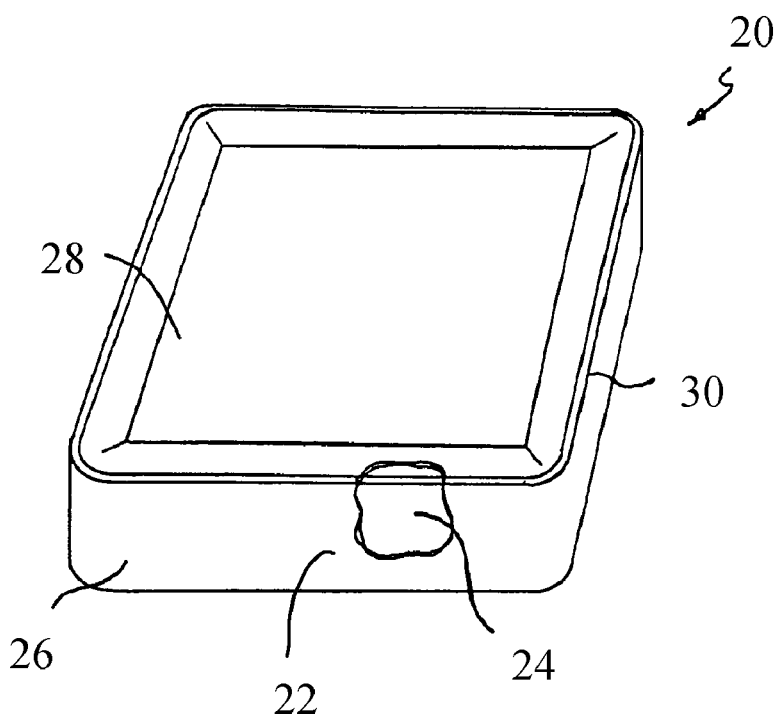
FIG. 1 is a perspective view, with a cutaway section, of a coated cutting insert in accordance with an embodiment of the present invention. In the cutaway section, a portion of the coating has been removed to reveal the substrate of the cutting insert.

FIG. 1 illustrates a coated cutting insert 20 having a coating 22 according to an embodiment of the present invention. A portion of the coating 22 is cutaway in FIG. 1 so as to show the underlying substrate 24. The coated cutting insert 20 has a flank surface 26 and a rake surface 28. The flank surface 26 and the rake surface 28 intersect to form a cutting edge 30 at the juncture thereof. It is to be appreciated that coated cutting inserts of the present invention may exhibit geometries that are different from the geometry of the coated cutting insert 20 shown in FIG. 1. For example, a coated cutting insert according to another embodiment of the present invention may contain a central aperture that is used to attach the coated cutting insert to a tool holder or the like.

Figure 2:
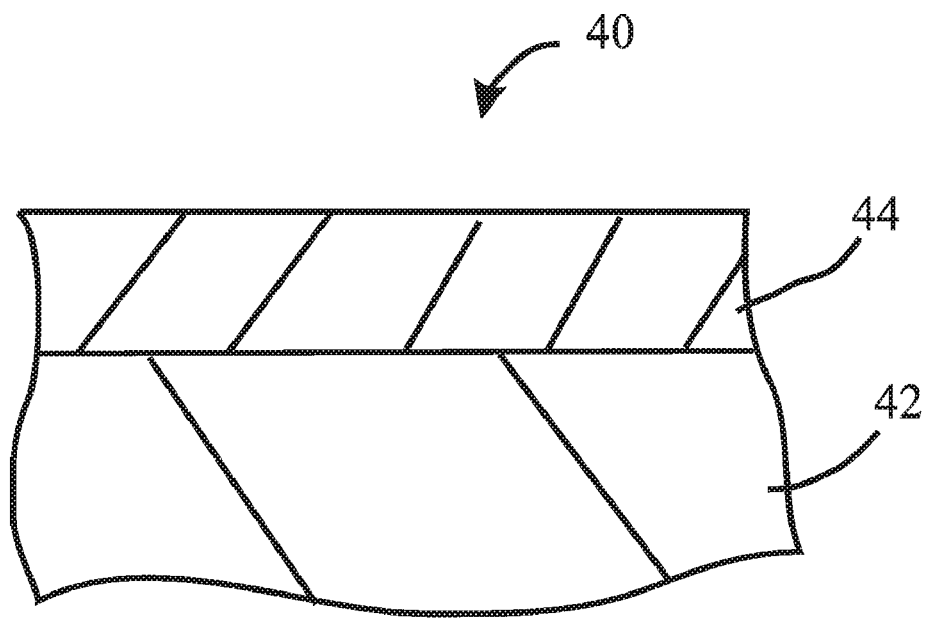
FIG. 2 is a schematic showing a cross-section of a single-layer coating of a coated substrate in accordance with an embodiment of the present invention.
Figure 3:
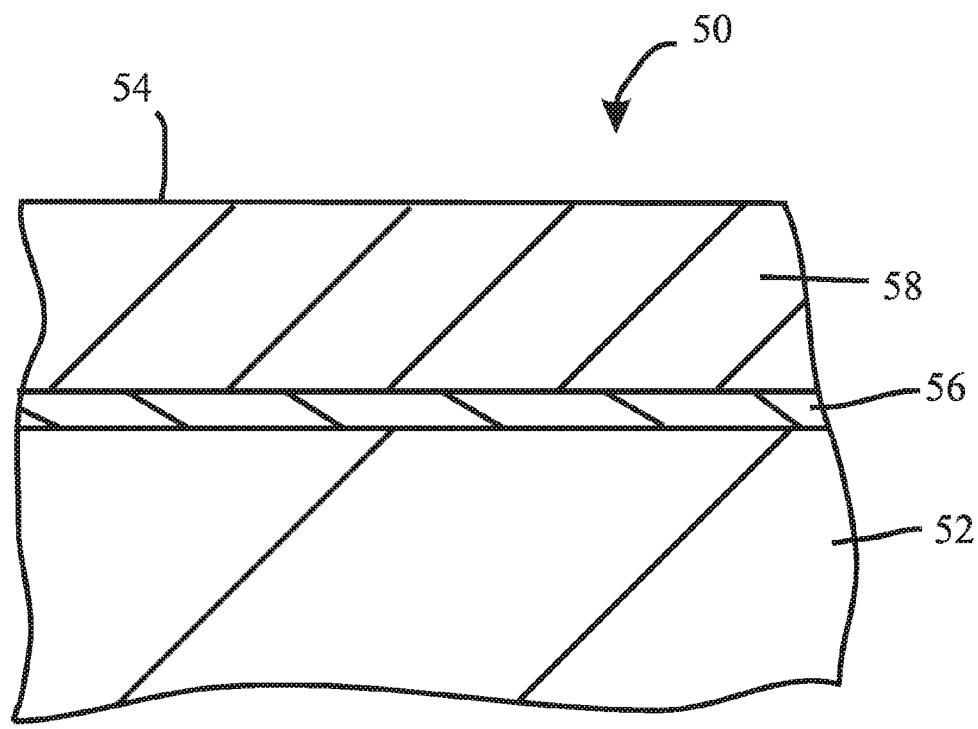
FIG. 3 is a schematic showing a cross-section of a coating of a coated substrate in accordance with an embodiment of the present invention, wherein the coating consists of an adhesion layer and a layer of either titanium oxycarbonitride or titanium aluminum oxycarbonitride.
Figure 4:
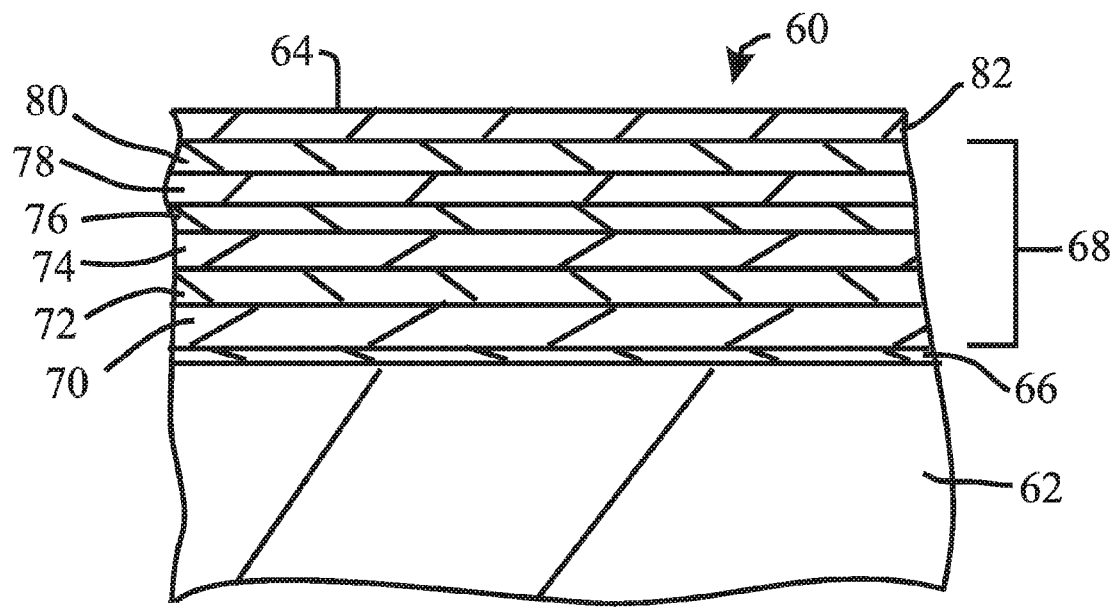
FIG. 4 is a schematic showing a cross-section of a coating of a coated substrate in accordance with an embodiment of the present invention, wherein the coating consists of an adhesion layer, a plurality of intermediate layers, and an outer layer.

FIGS. 2-4 illustrate portions of cross-sections of coated cutting inserts according to embodiments of the present invention at the interface of the coating and the substrate. It is to be understood that the representation of the layer thicknesses in these drawings are not to scale and are intended only to show the general spatial relationship of the layers and the substrate. Referring to FIG. 2 there is shown a coated cutting insert substrate 40 having a substrate 42 and a coating 44 consisting of a single layer of a titanium oxycarbonitride or a titanium aluminum oxycarbonitride according to the present invention. The coating 44 may have any desired thickness, but preferably has a thickness in the range of 1 to 25 microns.

Referring now to FIG. 3, there is shown a coated cutting insert substrate 50 having a substrate 52 and a coating 54 consisting of an adhesion layer 56 and a layer 58 of titanium oxycarbonitride or titanium aluminum oxycarbonitride according to the present invention. The adhesion layer 56 is chosen to enhance the adhesion of the layer 58 to the substrate 50, and is preferably one selected from the group consisting of titanium nitride and titanium carbon nitride. The thickness of the adhesion layer 56 is preferably in the range of 0.2 to 3 micrometers. The coating 54 may have any desired thickness, but preferably has a thickness in the range of 1 to 25 microns.

Referring now to FIG. 4, there is shown a coated cutting insert substrate 60 having a substrate 62 and a coating 64 consisting of an adhesion layer 66, a plurality of intermediate layers 68, i.e., intermediate layers 70, 72, 74, 76, 78, 80, and an outer layer 82. The composition of the adhesion layer 66 is selected to enhance the adhesion between the substrate 62 and the first intermediate layer 70. At least one of the plurality of intermediate layers 68 and/or the outer layer 82 is selected to be a layer of titanium oxycarbonitride or titanium aluminum oxycarbonitride according the present invention. The remaining intermediate layers of the plurality of intermediate layers 68 and/or the outer layer 82 may be any desired coating material, but preferably each such layer comprises a material chosen from the group consisting of titanium nitride, titanium carbonitride, aluminum oxide, zirconium nitride, and zirconium carbonitride. The remaining intermediate layers of the plurality of intermediate layers 68 and/or the outer layer 82 may also include titanium oxycarbonitride or titanium aluminum oxycarbonitride layer which are, respectively, other than the inventive titanium oxycarbonitride or the inventive titanium aluminum oxycarbonitride. At least one of the layers of titanium oxycarbonitride or titanium aluminum oxycarbonitride are working layers, i.e., layers which have thicknesses in the range of 1 to 20 micronmeters. The remaining intermediate layers of the plurality of intermediate layers 68 and/or the outer layer 82 may be working layers or they may be adhesion layers, i.e., layers having a thickness in the range of from 1 to 20 micrometers.

Suitable materials for the substrate of embodiments of the present invention, include, but are not limited to, cemented carbides (e.g., tungsten carbide-cobalt materials), ceramics (e.g., silicon nitride-based ceramics, SiAlON-based ceramics, titanium carbonitride-based ceramics, titanium diboride-based ceramics, and alumina-based ceramics), cermets (e.g., cermets that have nickel-cobalt binder and a high level of titanium and could further include tungsten carbide and titanium carbide), and steels.

The present invention also contemplates that the substrate may exhibit gradient compositions, especially in the binder concentration, the carbonitride concentration, and the carbide concentration. Exemplary substrates include cemented carbide substrates that have a surface zone of binder enrichment and cemented carbide substrates that exhibit a surface zone of binder depletion and/or solid solution carbide enrichment.

Other exemplary substrate materials are polycrystalline cubic boron nitride (PCBN) (exemplary PCBN materials include those with a ceramic or metallic binder) and other superhard materials.

One preferred substrate material is based on cobalt cemented tungsten carbide that comprises between about 0.1 weight percent and about 20 weight percent cobalt and the balance tungsten carbide. Such a cobalt cemented tungsten carbide may include elements like titanium, tantalum, niobium, zirconium, hafnium, vanadium, and chromium either alone or in any combination wherein these elements may be in the form of carbides and/or nitrides and/or carbonitrides.

It is also within the contemplation of the present invention that the substrate may comprise a coated core substrate so that the coating of the present invention is applied over part or all of the extant coating. The extant coating of the coated core substrate may have been applied by any known coating method, including, but not limited to chemical vapor deposition (CVD) (which may be low, medium, or high temperature CVD), physical vapor deposition (PVD), and combinations and variations thereof including those variations which use plasma enhancements, so long as the extant coating is compatible with the inventive coating and the MT-CVD deposition process used to apply the titanium oxycarbonitride or titanium aluminum oxycarbonitride layers of the inventive coating.

It is to be understood in the context of this specification and the appended claims that the term "substrate surface" refers to the outermost portion of the substrate that acts as substrate's interface with its environment. Thus, for a substrate consisting of an uncoated material, the substrate surface is the outer face of that material, whereas the substrate surface of a coated core substrate is the outermost face of its extant coating.

It is to be appreciated that prior to the deposition of a coating of the present invention the substrate surface may be treated to improve the adhesion of the coating to the substrate. Exemplary pre-treatments include a process to remove or reduce the level of binder at the substrate surface. In the case of the cobalt cemented tungsten carbide substrate, such a pre-treatment would remove cobalt from the substrate surface or treat the substrate surface to improve the coating adhesion. Another exemplary pre-treatment is a process that mechanically works the substrate surface so as to roughen it to enhance adhesion of the coating.

The titanium oxycarbonitride and the titanium aluminum oxycarbonitride layers of the coatings of the present invention have an oxygen to titanium atomic percent ratio in the range of about 0.01 to about 0.09 and an aluminum to titanium atomic percent ratio in the range of about 0 to about 0.1. The coatings have the ratio of their hardness values (in gigaPascals) to their Young's modulus values (in gigaPascals) at 0.06 or higher.

The titanium oxycarbonitride and titanium aluminum oxycarbonitride layers of the coatings of the present invention are applied to the substrate by MT-CVD at a substrate temperature in the range of from about 750 and about 950° C. using a mixture of gases comprising titanium tetrachloride ($TiCl_4$), a carbon source, e.g., acetonitrile ($CH_3CN$), nitrogen ($N_2$), hydrogen ($H_2$), an oxygen source, e.g., carbon monoxide (CO), nitrous oxide ($N_2O$), or nitric oxide (NO), and, when the layer comprises titanium aluminum oxycarbonitride, aluminum trichloride ($AlCl_3$), wherein the ratio of the hydrogen gas to the nitrogen gas, i.e., the $H_2/N_2$ ratio, is greater than 5. Preferably, these layers are applied in the substrate temperature range of between 800 and 950° C., and more preferably in the substrate temperature range of between 830 and 920° C. Preferably, the other layers of the coatings of the present invention are also applied by MT-CVD, although they may be deposited by other vapor deposition techniques. Regardless of the deposition techniques used for the various layers of the inventive coating other than the titanium oxycarbonitride and the titanium aluminum oxycarbonitride layers, it is preferred that the substrate be maintained under a protective atmosphere from the start of the deposition of the innermost layer of the coating to the end of the deposition of the outermost layer of the coating in order to prevent degradation or contamination of one or more layers of the coating.

The thickness of the layers of the coatings of the present invention may be controlled by adjusting the deposition time and/or deposition rate of each layer. It is to be appreciated that longer deposition times at a given deposition rate provide thicker layers, and that for a given deposition time, higher deposition rates provide thicker layers.

In some embodiments of the present invention, the surface of the inventive coating is subjected to a post-deposition treatment to control the smoothness and/or adhesion of the coating surface. A surface treatment typically reduces the tensile stresses or increases the compressive stresses in the coating. An example of such a treatment is given in PCT Patent Publication No. WO 02/077312 to Widia GmbH, which discloses shot blasting a coating to increase internal pressure stress or reduce internal tension stress in the outer coating layers. One exemplary treatment is the removal of asperities from the surface of the coating to reduce or minimize stress riser sites. Another exemplary treatment is to preferentially remove the coating (or a part of the coating layer) from selected areas of the coated cutting insert.

It is also to be appreciated that to improve adhesion of the layers of coatings of the present invention there may be provided microscopically rough interfaces between each of the coating layers. These microscopically rough interfaces can be generated by controlling the layer deposition parameters so as to promote high growth rates for the coating layers. High growth rates in CVD and MT-CVD processes may occur by the use of relatively high deposition temperatures and/or relatively high pressures. Another way to improve adhesion between coating layers is to reduce the existence of a sharp compositional interface between adjacent coating layers by gradually changing the composition of the layers during deposition.

EXAMPLES

Examples 1-5

Coated substrates according to embodiments of the present invention (Examples 1-5) were prepared by depositing a single layer of titanium oxycarbonitride or of titanium aluminum oxycarbonitride on a substrate. The substrate in each case was a WC-6% Co cemented carbide cutting insert. The compositions of the coatings are given in Table 1. The compositions were determined by a LECO Glow Discharge Spectrum (GDS) 850 A instrument using 2 millimeters of burn areas with current of 5.00 mA and DC voltage of 600V. The data collection rate was 125 points per second and the total burn time was about 600 seconds. The coatings were deposited by MT-CVD at substrate temperature of 850° C. using the combination of gases given in Table 2 for 120 minutes to produce coating thicknesses of 2 microns.

Comparative Samples

Coated substrates having the compositions reported in Table 1 for the samples Comparative 1 and 2 were prepared using same type of substrates as described above for Examples 1-5.

TABLE 1

| Identification | Ti (at %) | N (at %) | Al (at %) | O (at %) | C (at %) | O/Ti Ratio exp −2 | C/Ti Ratio exp −2 | N/Ti Ratio exp −2 | Al/Ti Ratio exp −2 |
|---|---|---|---|---|---|---|---|---|---|
| Example 1 | 50.78 | 21.88 | 0.15 | 2.94 | 23.97 | 6.0 | 47.0 | 44.0 | 0.29 |
| Example 2 | 48.37 | 22.31 | 0.18 | 4.05 | 24.74 | 8.0 | 51.0 | 46.0 | 0.37 |
| Example 3 | 50.56 | 23.07 | 0.02 | 2.81 | 23.31 | 6.0 | 46.0 | 46.0 | 0.03 |
| Example 4 | 51.37 | 20.76 | 0 | 2.13 | 25.65 | 4.0 | 50.0 | 40.0 | 0 |
| Example 5 | 54.37 | 19.37 | 0 | 2.19 | 24.00 | 4.0 | 44.0 | 36.0 | 0 |
| Comparative 1 | 50.33 | 21.07 | 0 | 0.4 | 28.11 | 0.79 | 55.9 | 41.9 | 0 |
| Comparative 2 | 51.08 | 24.86 | 0 | 0 | 23.91 | 0 | 0.47 | 0.49 | 0 |

TABLE 2

| Identification | CO (vol. %) | HCl (vol. %) | $AlCl_3$ (vol. %) | $H_2$ (vol. %) | $N_2$ (vol. %) | $TiCl_4$ (vol. %) | $CH_3CN$ (vol. %) | $H_2/N_2$ Ratio (exp −3) |
|---|---|---|---|---|---|---|---|---|
| Example 1 | 7.66 | 1.2 | 2 | 81.4 | 5.99 | 1.12 | 0.64 | 13.6 |
| Example 2 | 7.69 | 1.2 | 1.6 | 81.73 | 6.01 | 1.13 | 0.64 | 13.7 |
| Example 3 | 7.67 | 1.22 | 0.41 | 82.82 | 6.09 | 1.14 | 0.65 | 13.6 |
| Example 4 | 7.70 | 1.22 | 0 | 83.16 | 6.11 | 1.15 | 0.65 | 13.6 |
| Example 5 | 17.40 | 1.74 | 0 | 69.60 | 8.70 | 1.63 | 0.93 | 8.0 |
| Comp. 1 | 7.59 | 7.59 | 0 | 60.74 | 21.26 | 2.13 | 0.69 | 2.9 |
| Comp. 2 | 0 | 7.06 | 0 | 70.56 | 19.76 | 1.98 | 0.64 | 3.6 |

Properties of Examples 1-5 and Comparative 1-2

The hardness and Young's modulus of the coatings of Examples 1-5 and Comparative 1-2 are reported in Table 3. The hardness and Young's modulus measurements were made with a Fischerscope HM2000 according to ISO standard 14577 using a Vickers indenter. Indentation depth was set at 0.25 microns.

TABLE 3

| Identification | Hardness (GPa) | Young's Modulus (GPa) | H:E Ratio (exp-2) |
|---|---|---|---|
| Example 1 | 30.3 | 462.8 | 6.54 |
| Example 2 | 31.5 | 454.7 | 6.92 |
| Example 3 | 31.0 | 464.3 | 6.67 |
| Example 4 | 30.5 | 447.3 | 6.83 |
| Example 5 | 31.6 | 415 | 7.6 |
| Comparative 1 | 28.5 | 490 | 5.82 |
| Comparative 2 | 22.8 | 482.3 | 4.73 |

Cutting tests were conducted to compare coated cutting inserts having coatings according to the present invention to those having conventional coatings. In each case, the substrate was a WC—9.5 wt % Co cutting insert having the geometry of American National Standard Institute (ANSI) CNMG432RP. Two coated inserts of the present invention having coatings corresponding to Example 5 were prepared in the manner described above. For comparison, two coated inserts having a coating corresponding to Comparative 2 were prepared in the manner described above. The coated inserts were used in turning with 45 degrees out and a lead angle of −5 degrees to cut 304 stainless steel under a flood of coolant at 198 meters/minute (50 surface feet/minute), using a feed rate of 0.3 millimeters/revolution (0.012 inches/revolution), and a depth of cut of 2.03 millimeters (0.08 inches). End of life conditions were the first occurrence of one of the following conditions: (a) 0.305 millimeters (0.012 inches) of uniform wear; (b) 0.305 millimeters (0.012 inches) maximum wear; (c) 0.305 millimeters (0.012 inches) of nose wear; (d) 0.305 millimeters (0.012 inches) depth of notching; or (e) 0.102 millimeters (0.004 inches) of crater wear. The coated cutting inserts of the present invention had cutting lifetimes 11.9 and 13.9 minutes which terminated by reaching the notching depth limit. In contrast, the conventional coated cutting inserts had cutting lifetimes of only 8.9 and 11.0 minutes which terminated by reaching the maximum nose wear criterion. These tests demonstrate that the coatings of the present invention have significantly improved wear resistance over the prior art coatings.

While only a few embodiments of the present invention have been shown and described, it will be obvious to those skilled in the art that many changes and modifications may be made thereunto without departing from the spirit and scope of the present invention as described in the following claims. All patent applications, patents, and all other publications referenced herein are incorporated herein in their entireties to the full extent permitted by law.

What is claimed is:

1. A coated substrate comprising a substrate and a coating, the coating comprising at least one layer consisting of CVD titanium oxycarbonitride, wherein the layer has an oxygen to titanium atomic percent ratio in the range of about 0.01 to about 0.09, and the coating has a hardness in GPa to Young's modulus in GPa ratio of at least 0.06.

2. The coated substrate of claim 1, wherein the coating includes a plurality of layers.

3. The coated substrate of claim 2, wherein at least one layers of the plurality of layers comprises a material selected from the group consisting of titanium nitride, titanium carbonitride, aluminum oxide, zirconium nitride, and zirconium carbonitride.

4. The coated substrate of claim 2, wherein at least one of the layers of the plurality of layers is an adhesion layer.

5. The coated substrate of claim 4, wherein the adhesion layer is selected from the group consisting of titanium nitride and titanium carbonitride.

6. The coated substrate of claim 1, wherein the coating has a thickness in the range of from about 1 to about 25 microns.

7. The coated substrate of claim 1, wherein the at least one layer consisting of titanium oxycarbonitride has a thickness in the range of from about 1 to about 20 microns.

8. The coated substrate of claim 1, wherein the substrate is a cutting insert.

9. The coated substrate of claim 1, wherein the substrate comprises a material selected from the group consisting of a cemented carbide, a ceramic, a cermet, and a steel.

10. The coated substrate of claim 1, wherein the CVD titanium oxycarbonitride is the outer layer of the coating.

11. The coated substrate of claim 10, wherein the substrate comprises cemented carbide or polycrystalline cubic boron nitride.

12. The coated substrate of claim 10 further comprising a plurality of intermediate layers selected from the group consisting of zirconium nitride and zirconium carbonitride.

13. The coated substrate of claim 10 further comprising a plurality of intermediate layers including an aluminum oxide layer.

14. The coated substrate of claim 1 further comprising a PVD coating under the CVD titanium oxycarbonitride layer.

15. The coated substrate of claim 1, wherein the coating includes a plurality of layers.

16. The coated substrate of claim 15, wherein at least one layers of the plurality of layers comprises a material selected from the group consisting of titanium nitride, titanium carbonitride, aluminum oxide, zirconium nitride, and zirconium carbonitride.

17. The coated substrate of claim 15, wherein at least one of the layers of the plurality of layers is an adhesion layer.

18. The coated substrate of claim 17, wherein the adhesion layer is selected from the group consisting of titanium nitride and titanium carbonitride.

19. A coated substrate comprising a substrate and a coating, the coating comprising at least one layer consisting of CVD titanium aluminum oxycarbonitride, wherein the layer has an oxygen to titanium atomic percent ratio in the range of about 0.01 to about 0.09, an aluminum to titanium atomic percent ratio in the range of up to about 0.1, and the coating has a hardness in GPa to Young's modulus in GPa ratio of at least 0.06.

20. The coated substrate of claim 19, wherein the CVD titanium aluminum oxycarbonitride layer is the outer layer of the coating.

21. The coated substrate of claim 20 further comprising a plurality of intermediate layers selected from the group consisting of aluminum oxide, zirconium nitride and zirconium carbonitride.

22. The coated substrate of claim 19 further comprising a PVD coating under the CVD titanium oxycarbonitride layer.

23. The coated substrate of claim 19, wherein the substrate comprises a material selected from the group consisting of a cemented carbide, a ceramic, a cermet, and a steel.

* * * * *